(12) United States Patent
Kampfrath et al.

(10) Patent No.: US 8,935,846 B2
(45) Date of Patent: Jan. 20, 2015

(54) METHOD FOR CONTACTING A LIGHTING DEVICE AND CONNECTION ELEMENT FOR ATTACHMENT ON A LIGHTING DEVICE

(75) Inventors: Andreas Kampfrath, Niederstrotzingen (DE); Steffen Strauss, Nittendorf (DE)

(73) Assignee: Osram AG, Munich (DE)

( * ) Notice: Subject to any disclaimer, the term of this patent is extended or adjusted under 35 U.S.C. 154(b) by 171 days.

(21) Appl. No.: 13/514,642

(22) PCT Filed: Nov. 26, 2010

(86) PCT No.: PCT/EP2010/068315
§ 371 (c)(1),
(2), (4) Date: Aug. 20, 2012

(87) PCT Pub. No.: WO2011/069844
PCT Pub. Date: Jun. 16, 2011

(65) Prior Publication Data
US 2012/0311857 A1 Dec. 13, 2012

(30) Foreign Application Priority Data
Dec. 10, 2009 (DE) .......................... 10 2009 054 511

(51) Int. Cl.
*H01H 11/00* (2006.01)
*H01H 11/02* (2006.01)
(Continued)

(52) U.S. Cl.
CPC .................. *F21S 6/001* (2013.01); *F21V 23/06* (2013.01); *H05K 3/325* (2013.01); *F21V 23/04* (2013.01);
(Continued)

(58) Field of Classification Search
CPC ......... H05K 1/181; H05K 1/189; H05K 3/28; H05K 3/284; H05K 3/325; H05K 3/3405; H05K 2201/10106; H05K 2201/10401; H05K 2203/1189; F21S 4/003; F21S 4/006; F21V 31/04; F21V 23/00; F21V 23/04; F21V 23/06; F21Y 2103/003; H01L 2224/4801
USPC .............. 29/417, 622, 831, 846, 854; 257/99, 257/E33.066
See application file for complete search history.

(56) References Cited

U.S. PATENT DOCUMENTS 3,960,430 A    6/1976    Bunnell et al.
4,173,035 A    10/1979    Hoyt
(Continued)

FOREIGN PATENT DOCUMENTS

DE    20107824 U1    9/2001
DE    20315756 U1    4/2004
(Continued)

OTHER PUBLICATIONS

English abstract of EP1124297.
(Continued)

*Primary Examiner* — Paul D Kim (57) ABSTRACT

A method for contacting a lighting device is provided, wherein the lighting device has a circuit board which is covered at least partly by a sealing compound layer; wherein the lighting device can be separated at a separating point into two lighting device sections and each of the lighting device sections has at least one electrical contact. The method may include: removing at least the sealing compound layer on both sides of the separation point so that the contacts remain covered by a thinner, remaining sealing compound layer; separating the lighting device at the separation point; attaching a connection element at least to the remaining sealing compound layer of at least one of the lighting device sections, wherein the connection element has at least one contacting element, which contacts a respective contact covered by the remaining sealing compound layer after a separation or penetration of the remaining sealing compound layer.

14 Claims, 4 Drawing Sheets

(51) Int. Cl.
*H01H 65/00* (2006.01)
*H01H 11/04* (2006.01)
*F21S 6/00* (2006.01)
*F21V 23/06* (2006.01)
*H05K 3/32* (2006.01)
*F21V 23/04* (2006.01)
*F21V 31/04* (2006.01)
*F21Y 101/02* (2006.01)
*H05K 1/11* (2006.01)
*H05K 3/00* (2006.01)
*H05K 3/28* (2006.01)

(52) U.S. Cl.
CPC .............. *F21V 31/04* (2013.01); *F21Y 2101/02* (2013.01); *H05K 1/118* (2013.01); *H05K 3/0052* (2013.01); *H05K 3/28* (2013.01); *H05K 2201/10106* (2013.01); *H05K 2201/10189* (2013.01); *H05K 2201/10446* (2013.01); *H05K 2203/0195* (2013.01); *H05K 2203/1322* (2013.01)
USPC .................. 29/622; 29/417; 29/831; 29/846; 29/854; 257/99; 257/E33.066

(56) References Cited

U.S. PATENT DOCUMENTS

| | | | |
|---|---|---|---|
| 5,559,681 | A | 9/1996 | Duarte |
| 6,017,241 | A * | 1/2000 | Komai ........................ 439/419 |
| 8,403,534 | B2 * | 3/2013 | Van Bommel et al. .. 362/249.03 |
| 2008/0278954 | A1* | 11/2008 | Speier ........................ 362/373 |
| 2009/0291587 | A1 | 11/2009 | Sato et al. |
| 2010/0127283 | A1* | 5/2010 | van de Ven et al. ............. 257/89 |

FOREIGN PATENT DOCUMENTS

| | | |
|---|---|---|
| DE | 10319525 A1 | 11/2004 |
| EP | 0760448 A2 | 3/1997 |
| EP | 0911573 A2 | 4/1999 |
| EP | 1124297 A1 | 8/2001 |
| EP | 2209165 A1 | 7/2010 |

OTHER PUBLICATIONS

English abstract of DE20315756.
English abstract of DE10319525.

* cited by examiner

METHOD FOR CONTACTING A LIGHTING DEVICE AND CONNECTION ELEMENT FOR ATTACHMENT ON A LIGHTING DEVICE

Related Applications

The present application is a national stage entry according to 35 U.S.C. §371 of PCT application No.: PCT/EP2010/068315 filed on Nov. 26, 2010, which claims priority from German application No.: 10 2009 054 511.5 filed on Dec. 10, 2009.

TECHNICAL FIELD

Various embodiments relate to a method of contacting a lighting device, wherein the lighting device has a circuit board which is covered at least partly by a sealing compound layer: wherein the lighting device can be separated at a separating point into two lighting device sections and each of the lighting device sections has at least one electrical contact adjacent to the separating point. Various embodiments also relate to a tool for performing the method. Various embodiments further relate to a plug-in connector for attachment on a lighting device.

BACKGROUND

LED strips able to be separated into a number of sections are known, e.g. the LINEARLight series from Osram, which is inserted into a strip-shaped U-profile made of silicon and is sealed in the profile with a sealing mass made of silicon. In these lights, for contacting the separated LED strip sections, their end-face contacts are revealed and contacted. During contacting with a contacting element a seal of the LED strip or LED strip section can be removed far enough for a protective function or protection class to be adversely affected. To maintain the protective function or protection class it is known that the contacting element can be encapsulated afterwards with silicon, which is an expensive process.

As an alternative encapsulated LED strips also with encapsulated plug-in connectors are known. The disadvantage of these devices is that this reduces flexibility when configuring strip lengths and is comparatively expensive.

SUMMARY

Various embodiments may at least partly remedy the disadvantages of the prior art and may provide a way of contacting sealed light strips in a simple manner which can maintain a protective function.

Various embodiments provide a method for contacting a lighting device, wherein the lighting device has a circuit board which is covered at least partly by a sealing compound layer, wherein the lighting device is able to be separated at a separation point into two lighting device sections and each of the lighting device sections adjacent to the separating point has at least one electrical contact; wherein the method may have at least the following:

Removing at least the sealing compound layer on both sides of the separation point above the adjacent contacts of the lighting device sections so that the contacts remain covered by a thinner remaining sealing compound layer;
Separating the lighting device at the separation point;
Attaching a connection element at least to the remaining sealing compound layer of at least one of the lighting device sections, wherein the connection element has at least one contacting element which contacts a respective contact covered by the remaining sealing compound layer after a separation or puncturing of the remaining sealing compound layer.

This method makes the contacts easy to reach by virtue of the thin(ner) remaining sealing compound layer and able to be contacted without further expense by insulation displacement. The remaining sealing compound layer acts in relation to the contacting element as a seal so that an additional sealing step (e.g. by encapsulation) can be dispensed with.

The connecting element is used for electrical connection of the circuit board for transmission of energy and/or data.

Any point of the wiring suitable for external contacting can be used for electrical contact of the circuit board, e.g. a sufficiently wide conductor track or a contact area specifically provided for contacting such as a contact bump or a contact field ("contact pad") etc.

One embodiment is that the sealing compound layer is separated by means of two essentially vertical cuts in the area on both sides of the separation point above the contacts (especially through to the circuit board) and at least between the vertical cuts additionally laterally by means of at least one horizontal cut at a height above the contacts. The lighting device can be prepared with simple means in this way.

It is also an embodiment for the circuit board and the sealing compound layer to be included in a profile and for at least a part of the profile to be removed on both sides of the separation point together with the sealing compound layer, preferably within the framework of the same separation steps. The profile in this case can likewise just be removed above the contacts, which is especially easy and quick to do. As an alternative the profile can be removed completely, for example in the area delimited by the vertical cuts, to make a compact form of the connecting element possible. The connection element can also be applied directly in this form by its lower side to the circuit board.

It is also an embodiment for the connection element to be placed at least on a part of the remaining sealing compound layer and for an electrical connection to the contact, to penetrate the remaining sealing compound layer located above the contact by means of an electrical contacting element. In particular the connection element can be placed on the entire remaining sealing compound layer and optionally additionally on the non-thinned-down sealing compound layer in order to further increase a degree of sealing.

It is also an embodiment for the contacting element to have a cutting edge for cutting or penetrating separation of the remaining sealing compound layer. This makes contacting easier.

The connection element can especially be a plug-in connector.

It is also an embodiment for the contacting element to be located partly in a plug receptacle and at least on a first insertion of a connection pin into the plug receptacle for the contacting element to be pushed by means of the connector pin through the remaining sealing compound layer down onto the contact. This enables a greater contact pressure and consequently a secure contacting to be achieved.

It is yet another embodiment for the contacting element to be pushed during a placement movement of the connecting element through the remaining sealing compound layer onto the contact.

It is a development for the placement movement of the connecting element to include a sliding movement. This enables the at least one electrical contact to be contacted when the connection element is pushed onto the lighting device for example.

A further development is that the placement movement of the connection element includes a vertical placement movement. This enables the at least one electrical contact to be contacted for example when a connection element is pushed onto the lighting device. Thus the connection element can be embodied in two parts here for example, with the two parts being placed on the lighting device and then being latched on by applying pressure. The latching process in this case provides the vertical placement movement. As an alternative or in addition the electrical contact can be made or fastened by clipping, clamping, screwing etc.

A further embodiment is for the circuit board to be a strip-type circuit board, especially a strip-type flexible circuit board. This can be contacted especially easily by means of the said method, especially in an area of longitudinal ends.

A further embodiment is for the sealing compound material to be an elastic basic material, especially silicon. This enables the mechanical flexibility of the lighting device, especially the lighting strip, to be maintained at least to a limited extent.

Various embodiments provide a tool for performing the method, wherein the tool is a pair of cutting pliers having a vertical double cutting edge and a horizontally movable cutting edge. This enables the step of removing at least the sealing compound layer to be carried out simply and within a single step of a sequence.

Various embodiments provide a connection element for attaching on a lighting device, whereby the connection element has at least one contacting element for separating or penetrating the remaining sealing compound layer.

A development is that the contacting element has a cutting edge. This makes it easier to separate or penetrate the remaining sealing compound.

For this purpose the lighting device can especially be a circuit board covered with a sealing compound layer, wherein the lighting device has at least one area with a thinner remaining sealing compound layer, wherein at least one electrical contact is covered by the remaining sealing compound layer.

Various embodiments may achieve one or more of the following:
- separation of sealed circuit boards, especially flexible light strips by the customer is possible, if necessary with a special tool;
- simple, sealed assembly of a connecting element, especially plug-in connector, by a customer is possible without losing the IP classification,
- the customer can easily configure the length,
- no appreciable loss of the bendability of flexible circuit boards occurs,
- the connection elements are able to be combined with other systems,
- manufacturing (especially and encapsulation step) is simplified since the strips do not have to be manufactured indiscreet lengths that can be manufactured in almost infinite lengths.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

Figure 1:
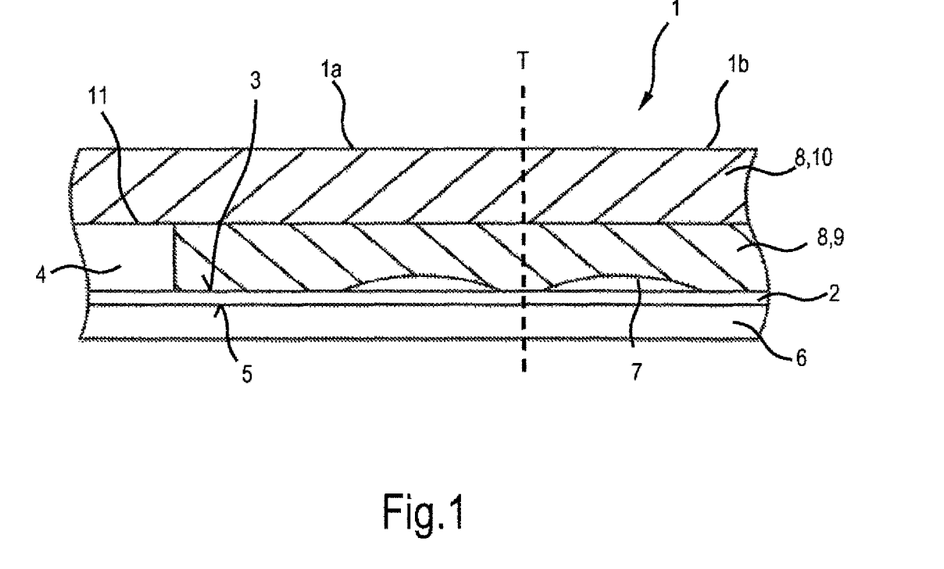
FIG. 1 shows a sectional diagram viewed from the side of a separable light strip.
Figure 2:
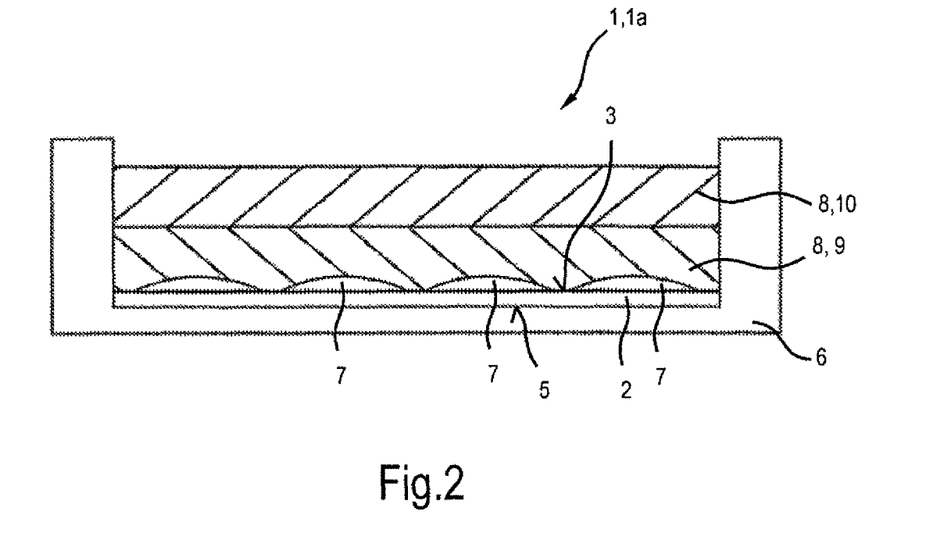
FIG. 2 shows the separable light strip as a sectional diagram viewed from the front.

FIG. 1 shows a sectional diagram viewed from the side of a section of an inventive light strip 1. FIG. 2 shows the light strip 1 as a sectional diagram viewed from the front.

Referring to FIG. 1 and FIG. 2, the present lighting device in the form of a light strip 1 has a strip-type flexible circuit board 2, of which the upper side or front side 3 is equipped with light emitting diodes 4 disposed in series. A rear side 5 of the circuit board 2 is attached to a base of a longitudinal profile 6 with a U-shaped cross-section (see FIG. 2). The profile 6 can have silicon as its basic material to enable flexibility of the light strip 1 to be at least partly retained. The profile 6 can especially consist of an opaque material. The light emitting diodes 4 emit light upwards from the open side of the profile 6, wherein the profile projects upwards above the equipped circuit board 2, 4.

Located on the front side 3 of the circuit board 2 is wiring for elements attached thereto (light emitting diodes 4 and if necessary further electronic components such as driver chips, capacitors and/or resistors), with only electrical contacts 7 of the wiring being shown. The electrical contacts 7 can for example be located on both sides of a separation point T at which the light strip 1 or the encapsulated circuit board 2, 4, 8 is able to be separated into two light strip sections 1a, 1b and is thus able to be configured.

The equipped circuit board 2, 4 is sealed with a sealing layer 8 within the profile 6, which consists of two layers of sealing compound 9, 10 above one another. A lower first sealing layer 9, which has been applied first, covers the circuit board 2 up to an upper side 11 of the light emitting diodes 4. The upper side 11 is not covered by the first sealing layer 9 and features the light exit area of the light emitting diodes 4. The profile 6 and the first sealing layer 9 protect the equipped circuit board 2, 4 up to the height of the upper side(s) 11 of the light emitting diode(s) 4, e.g. to fulfill an IP class.

The first sealing layer 9 is impermeable to light and for a uniform color impression is embodied from the same color as the profile 6. This can for example be achieved by a color additive (colored filler particles etc.) to an otherwise non-colored basic material. Thus the equipped circuit board 2, 4 remains, except the respective upper side 11 of the light emitting diode(s) 4, concealed from external view. The first sealing layer 9 can have silicon as its basic material, in order to provide good processability with a high degree of protection, good resistance to ageing and flexibility. There is also no mismatch in relation to the material of the profile 6 and a very good connection with said material is achieved.

To also protect the upper side 11 of the light emitting diode(s) 4, a second, now transparent or highly light-permeable sealing layer 10, with a high transmissivity is applied to the first sealing layer 9, e.g. made of silicon without added color. The equipped circuit board 2, 4 is completely sealed by the second sealing layer 10 and thus protected. The second sealing layer 10 advantageously features the same sealing material as the first sealing layer 9.

Figure 3:
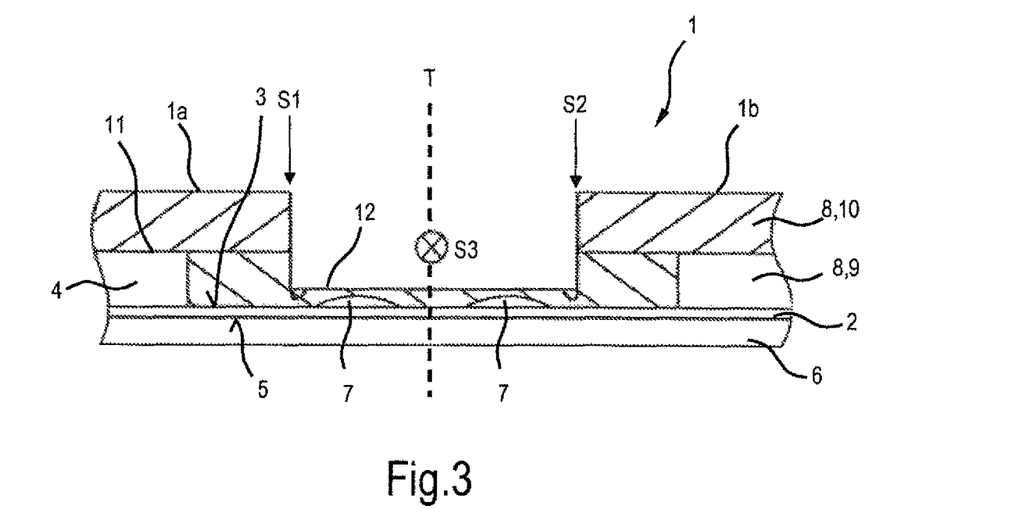
FIG. 3 shows a sectional diagram viewed from the side of the light strip with a sealing compound layer removed on both sides of the separation point.

FIG. 3 shows the light strip 1, in which the sealing layer 8 has been removed on both sides of the separation point T above the adjacent contacts 7 of the light strip sections 1a, 1b so that the contacts 7 are still covered by a thin, remaining sealing layer 12.

The sealing layer 8 can for example be removed by the light strip 1 first being provided on both sides of the contacts 7 with horizontal cuts S1 and S2 for separating the sealing layer 8 and the profile 6 through to the circuit board 2 at a maximum. Within the area delimited by the two vertical cuts S1 and S2 are located the contacts 7 adjacent to the separation point T. The perpendicular or vertical cuts S1 and S2 are preferably made symmetrically to the separation point.

At the same time or subsequently the light strip 1 (i.e. its sealing layer 8 and profile 6) is separated at least in the area delimited by the two perpendicular cuts S1 and S2 by a horizontal cut S3 at a height which is greater than the height of the electrical contacts 7. This means that the thinner remaining sealing layer 12 remains on the contacts 7.

For mechanically simple and precise separation the sealing layer 8 and the profile 6 can be temporarily solidified or made brittle before the cuts S1 to S3 are made, e.g. by application of a cold spray medium, liquid nitrogen etc.

Figure 4:
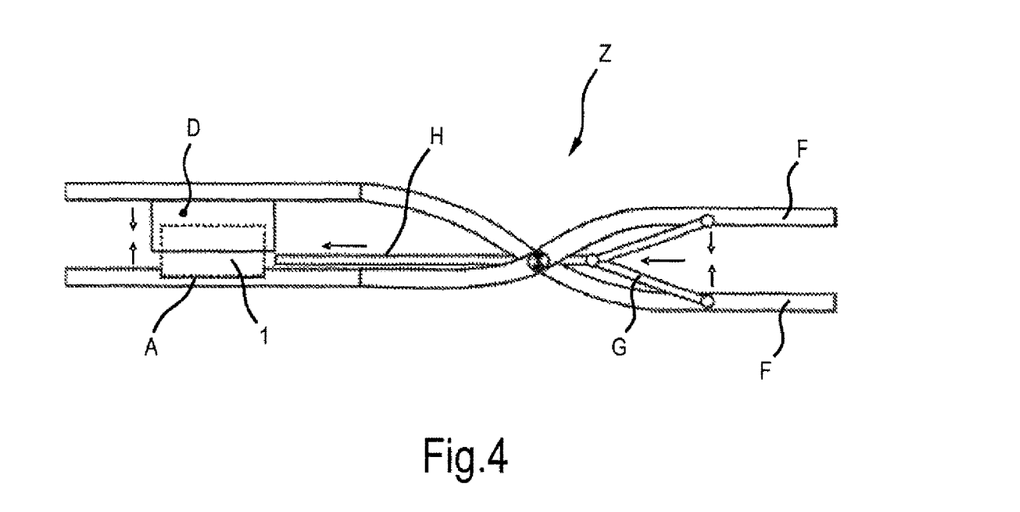
FIG. 4 shows a side view of a possible tool for removing the sealing compound layer.

FIG. 4 shows a side view of a possible tool for removing the sealing layer 8 and the profile. The tool is embodied as a pair of cutting pliers Z, which has an effective area with a double cutter D with two parallel, vertically-arranged single cutters, which are intended to make the vertical cuts S1 and S2 in the light strip 1. For a corresponding positioning of the light strip 1 the arm of the pliers head opposite to the double cutter D has a receptacle A for the light strip 1. In addition the pair of cutting pliers Z has a horizontally movable cutter H which is intended to make the horizontal cut S3. The horizontally movable cutter H can be articulated by a pushrod G on the handles F of the pair of cutting pliers Z.

When the pair of cutting pliers Z is actuated by pressing together the handles F the double cutter D moves towards the light strip 1, cuts into the latter and thus creates the vertical cuts S1 and S2. At the same time the horizontally movable cutter H is pushed forward, cuts laterally and horizontally into the light strip 1 and in this way creates the horizontal cut S3. When this is done a tilting of the light strip 1 by the double cutter D is prevented.

For correct positioning of the pair of cutting pliers Z in relation to the separation point T of the light strip 1 the light strip 1 can have one or more corresponding markings (upper diagram).

Subsequently the cut-out material can be removed and the cut points produced by the cuts S1 to S3 can be cleaned and/or deburred.

Figure 5:
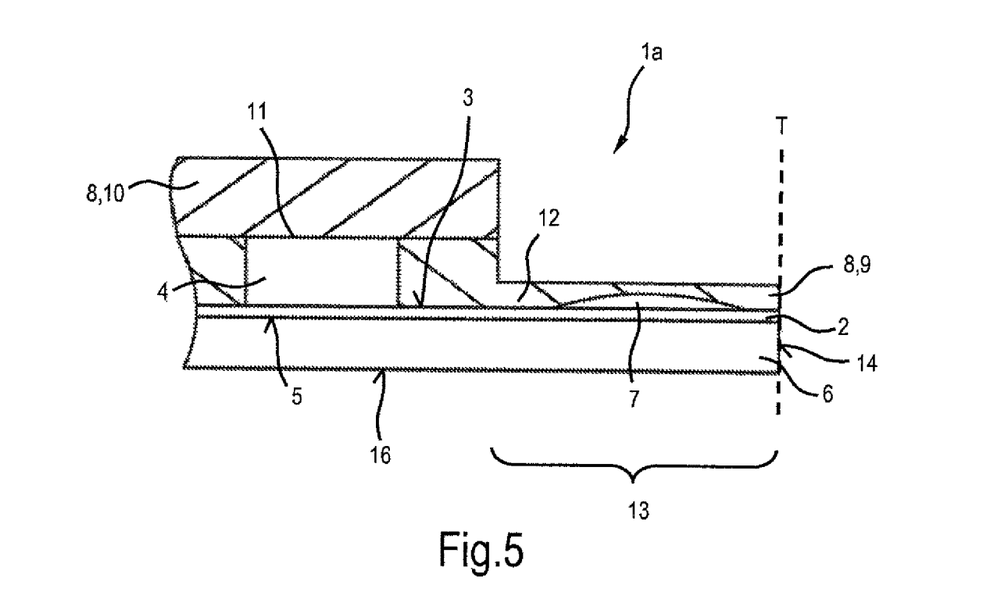
FIG. 5 shows a sectional diagram viewed from the side of a light strip section in the area of a separated end.

FIG. 5 shows a cross section from the light strip section 1a in an area of its long side end 13, which has been formed by a separation or cutting of the light strip 1 along the separation point T following the removal of the sealing layer 8 and the profile 6. Located at the end 13 or at a slight distance from an associated cut edge 14 are the contacts 7, which are covered by the remaining sealing layer 12. Present at the cutting edge 14 is an open copper cut edge, which is formed as a result of the conductor tracks being cut through.

Figure 6:
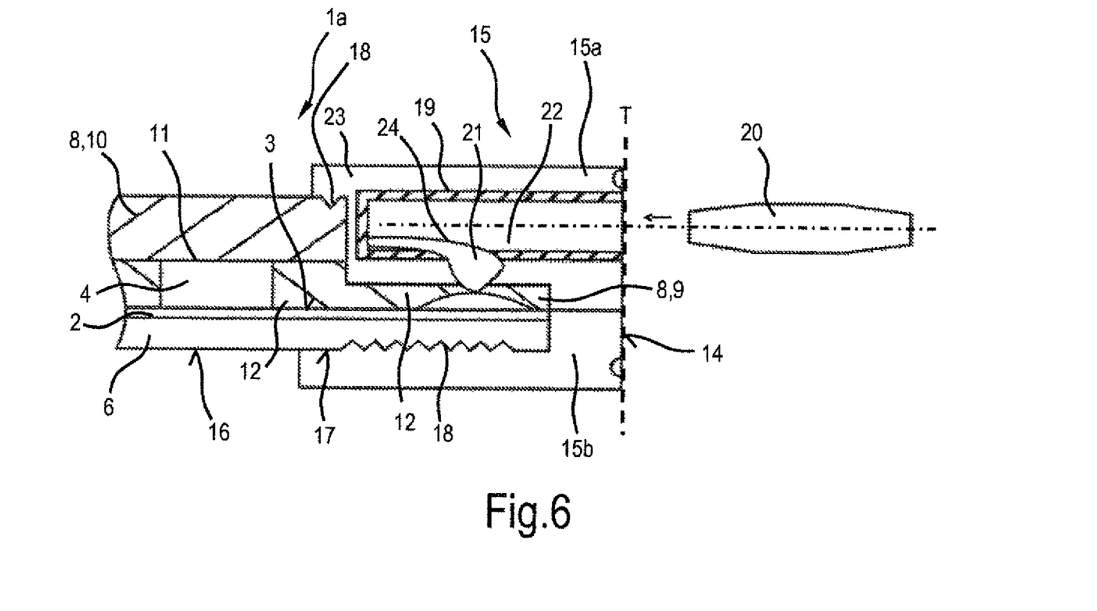
FIG. 6 shows a light strip section with a plug-in connector mounted on the end side thereof in accordance with a first embodiment.

FIG. 6 shows the cross section of light strip section 1a from FIG. 5, with a connection element in the form of a plug-in connector 15 now having been attached to the remaining sealing layer 12. The plug-in connector 15 is a two-part connector constructed from or composed of an upper plug-in connector part 15a and a lower plug-in connector part 15b.

The lower plug-in connector part 15b is placed from below in the area of the end 13 on the rear side 16 of the light strip section 1a such that the lower plug-in connector part 15b, as well as the rear side 16, also covers a lower part of the cut edge 14. So that the lower plug-in connector part 15b and the plug-in connector 15 cannot be pulled off the end 13, the lower plug-in connector part 15b is provided with structuring at its contact surface 17 with the rear side 16, here: rifling or insulation displacement lips 18, which can press into the rear side 16, which is formed from the profile 6 from the silicon. Through these insulation displacement lips 18 a sealing of the plug-in connector 15 on the light strip section 1a can be achieved, which can further improve a protection classification. For this purpose the insulation displacement lips 18 cut through or press into the material of the profile 6 and form a seal by warping the sealing material (e.g. silicon).

The full surface of the upper plug-in connector part 15a is placed from above on the remaining sealing layer 12, with the upper plug-in connector part 15a surrounding the cut edge 14, in order to cover its upper part, which is not covered by the lower plug-in connector part 15b. At an edge pointing away from the end 13 or the cut edge 14, the upper plug-in connector part 15a contacts the non-removed sealing material layer 8 and at this contact surface likewise has a notch or insulation displacement lip 18, in order to prevent the upper plug-in connector part 15a or the plug-in connector 15 releasing from the light strip section 1a.

To assemble the plug-in connector 15 the upper plug-in connector part 15a and the lower plug-in connector part 15b are pressed together and locked during the process, e.g. by means of latching hooks.

The plug-in connector 15 is embodied here in the form of a female socket and, to accommodate a plug pin 20, has a plug receptacle 19 open on the end face side. Located in the plug receptacle 19 is a connection pin or contact pin 21, which can project through an opening 22, e.g. a slot, in the plug receptacle 19 and a housing 23 of the upper plug-in connector 15a downwards or in the direction of the remaining sealing layer 12. The contact pin 21 can already project to some degree before any first use (introduction of the connector pin 20) through the opening 22 or not yet through the opening 22. With insertion of the connector pin 20 (as indicated by the arrow) this strikes the upper side 24 of the contact pin 21 and presses this downwards through the opening 22 and further through the rest of the sealing layer 12 to the associated contact 7. The contact pin 21 thus punctures the remaining sealing layer 12 when this is done. The connector pin 20 can thus contact the contact 7 via the contact pin 21. FIG. 6 shows the contact pin 21, as it contacts the contact 7, only for improved clarity with the connector pin 20 not plugged in. The contact pin 21 can, for simple penetration of the remaining sealing compound layer 12 and penetration into the contact 7, have a cutting edge on its lower side and thus be embodied as an insulation displacement contact.

The contact pin 21 has a sprung support or is elastically deformable, in order to avoid breaking or damage by a plastic deformation.

The remaining sealing compound layer 12 serves as sealing material for the plug-in connector 15, especially as a seal for the contact pin 21.

Figure 7:
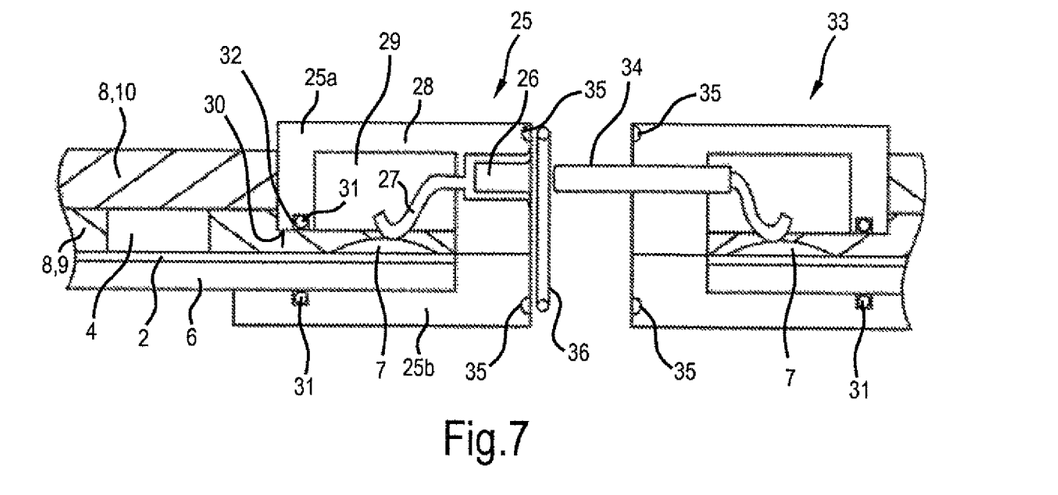
FIG. 7 shows a light strip section with a plug-in connector mounted on the end side thereof in accordance with a second embodiment.

FIG. 7 shows a cross section from the light strip section 1a from FIG. 5, with a female plug-in connector 25 in accordance with a second embodiment now having been attached to the remaining sealing compound layer 12. An upper plug-in connector part 25a of the plug-in connector 25 now has a connector receptacle 26 auf, in which no contact pin is arranged. Instead the contact pin 27 adjoins the rear side of the plug-in connector receptacle 26 and projects downwards out of a housing 28 of the upper plug-in connector part 25a. To this end the contact pin 27 is accommodated in a housing space 29 in which it can move. The housing 28 is now equipped on its rearwards contact edge 30 with an insulation displacement lip or the like, but has a sealing element 31 for sealing which is inserted into a corresponding groove 32. A lower plug-in connector part 25b of the plug-in connector is similar to the lower plug-in connector part 15b, except that here too, instead of an insulation displacement lip, a sealing element 31 is used for sealing.

To install the plug-in connector 25, as in the first embodiment, the upper plug-in connector part 25a and the lower plug-in connector part 25b can be placed on the first light strip section 1a and then pressed together to join the two parts, e.g. latched and/or glued. Here too the contact pin 27 has a lower cutting edge, so that during assembly it cuts into the remaining sealing compound layer 12 and makes contact with the contact 7.

The plug-in connector 25 can also be designed in one piece and pushed onto the first light strip section 1a for example.

The mating male plug-in connector 33 mounted on the second light strip section 1b is constructed in a similar way to the plug-in connector 25, except that instead of the connector receptacle 26, a connector pin 34 is present. Both plug-in connectors 25 and 33 have an annular groove 34 running around their end face side to accommodate an O-ring 36.

Figure 8:
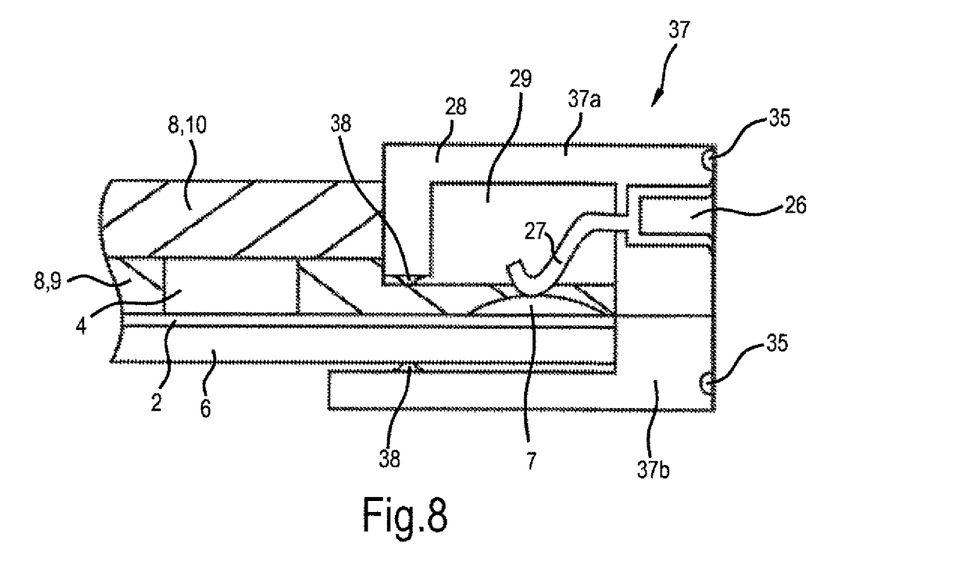
FIG. 8 shows a light strip section with a plug-in connector mounted on the end side thereof in accordance with a third embodiment.

FIG. 8 shows a first light strip section 1a with a female plug-in connector 37 mounted thereon on the end side in accordance with a third embodiment. The female plug-in connector 37 (and for example also the male counterpart, upper diagram) differ from the connector 25 merely in that, instead of a separate sealing element 31, a sealing lip 38 attached to the housing 28 is used.

Naturally the present invention is not restricted to the exemplary embodiment shown.

The profile can thus be completely removed in the area of the long-side end of a light strip or light strip section, so that the plug-in connectors contact the circuit board from below.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE CHARACTERS

1 Light strip
1a Light strip section
1b Light strip section
2 Circuit board
3 Front side
4 Light emitting diode
5 Rear side
6 Profile
7 Electrical contact
8 Sealing compound layer
9 First sealing layer
10 Second sealing layer
11 Upper side of the light emitting diode
12 Remaining sealing compound layer
13 Long-side end
14 Cutting edge
15 Plug-in connector
15a Upper plug-in connector part
15b Lower plug-in connector part
16 Rear side
17 Contact surface
18 Insulation displacement lip
19 Connector receptacle
20 Connector pin
21 Contact pin
22 Opening
23 Housing of upper plug-in connector part
24 Upper side of the contact pin
25 Plug-in connector
25a Upper plug-in connector part
25b Lower plug-in connector part
26 Connector receptacle
27 Contact pin
28 Housing
29 Housing space
30 Contact edge
31 Sealing element
32 Groove for the sealing element
33 Plug-in connector
34 Plug-in connector pin
35 Annular groove
36 O-ring
37 Plug-in connector
38 Sealing lip
A Receptacle
D Double cutter
F Handle
G Pushrods
H Horizontally-movable cutter
S1 Vertical cut
S2 Horizontal cut
S3 Horizontal cut
T Separation point
Z Cutting pliers

The invention claimed is:

1. A method for contacting a lighting device, wherein the lighting device has a circuit board which is covered at least partly by a sealing compound layer; wherein the lighting device can be separated at a separating point into two lighting device sections and each of the lighting device sections, adjacent to the separating point, has at least one electrical contact; wherein the method comprises:

removing at least portions of the sealing compound layer on both sides of the separation point above the electrical contacts of the lighting device sections adjacent to the separating point so that the electrical contacts adjacent to the separating point remain covered by a thinner, remaining sealing compound layer;

separating the lighting device at the separation point into the two lighting device sections; and attaching a connection element at least to the remaining sealing compound layer of at least one of the lighting device sections, wherein the connection element has at least one contacting element, which contacts a respective contact covered by the remaining sealing compound layer after a separation or penetration of the remaining sealing compound layer.

2. The method as claimed in claim 1, wherein at least the sealing compound layer is cut into by means of two essentially vertical cuts on both sides of the separation point above the contacts and at least between the vertical cuts is additionally separated by means of at least one horizontal cut at a height above the contacts.

3. The method as claimed in claim 1, wherein the circuit board and the sealing compound layer are accommodated in a profile and at least a part of the profile is removed on both sides of the separation point together with the sealing compound layer.

4. The method as claimed in claim 1, wherein the connection element is placed at least on a part of the remaining sealing compound layer and for an electrical connection to the contact separates or penetrates the remaining sealing compound layer located above the contact by means of a contacting element.

5. The method as claimed in claim 4, wherein the contacting element has a cutting edge for separating or penetrating the remaining sealing compound layer.

6. The method as claimed in claim 4, wherein the connection element is a plug-in connector.

7. The method as claimed in claim 6, wherein the contacting element is located partly in a connector receptacle and at least during a first plugging in of a plug pin into the connector receptacle the contacting element is pushed by means of the plug pin through the remaining sealing compound layer down onto the contact.

8. The method as claimed in claim 1, wherein the contacting element during an insertion movement of the plug-in connector is pressed through the remaining sealing compound layer down onto the contact.

9. The method as claimed in claim 8, wherein the insertion movement of the connection element comprises a sliding movement.

10. The method as claimed in claim 8, wherein the insertion movement of the connection element comprises a vertical insertion movement.

11. The method as claimed in claim 1, wherein the circuit board is a strip-type circuit board.

12. The method as claimed in claim 11, wherein the circuit board is a strip-type flexible circuit board.

13. The method as claimed in claim 1, wherein the sealing compound material features an elastic base material.

14. The method as claimed in claim 13, wherein the sealing compound material features silicon.

* * * * *